(12) United States Patent  
Stephenson et al.

(10) Patent No.: US 8,269,497 B2  
(45) Date of Patent: Sep. 18, 2012

(54) ENHANCED FILL-FACTOR NMR COILS AND ASSOCIATED METHODS

(75) Inventors: James C. Stephenson, Salt Lake City, UT (US); Bruce K. Gale, Taylorsville, UT (US); Cynthia Furse, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 666 days.

(21) Appl. No.: 12/159,848

(22) PCT Filed: Jan. 4, 2007

(86) PCT No.: PCT/US2007/000243  
§ 371 (c)(1),  
(2), (4) Date: Sep. 22, 2009

(87) PCT Pub. No.: WO2007/102932  
PCT Pub. Date: Sep. 13, 2007

(65) Prior Publication Data  
US 2010/0001730 A1 Jan. 7, 2010

Related U.S. Application Data

(60) Provisional application No. 60/756,476, filed on Jan. 4, 2006.

(51) Int. Cl.  
*G01V 3/00* (2006.01)
(52) U.S. Cl. ........................ 324/318; 324/321
(58) Field of Classification Search ................... 324/318, 324/321, 322  
See application file for complete search history.

(56) References Cited

U.S. PATENT DOCUMENTS

| | | | |
|---|---|---|---|
| 4,581,263 A | 4/1986 | Lukas | |
| 5,552,709 A | 9/1996 | Anderson | |
| 5,684,401 A * | 11/1997 | Peck et al. | 324/318 |
| 5,866,427 A | 2/1999 | Mendelson et al. | |
| 6,046,592 A | 4/2000 | Rathke et al. | |
| 6,822,454 B2 | 11/2004 | Peck et al. | |
| 6,876,200 B2 | 4/2005 | Anderson et al. | |
| 7,327,143 B2 * | 2/2008 | Martin | 324/318 |
| 2004/0245463 A1 | 12/2004 | Wood et al. | |
| 2005/0253587 A1 | 11/2005 | Peck et al. | |
| 2009/0295389 A1 * | 12/2009 | Pruessmann et al. | 324/318 |

FOREIGN PATENT DOCUMENTS

WO     WO97/28465     8/1997

* cited by examiner

*Primary Examiner* — Louis Arana  
(74) *Attorney, Agent, or Firm* — Thorpe North & Western LLP

(57) ABSTRACT

An NMR probe which includes a probe matrix (24) having a void sample (28) volume therein. A conductive coil (16, 26) can be at least partially embedded in the probe matrix (24). By embedding the conductive coil (16, 26) in the probe matrix (24), the fill-factor can be significantly increased. NMR probes can be formed by a method which includes wrapping a conductive wire (16) around a coil form (18) to produce a coil precursor assembly. The probe matrix (24) can be formed around the conductive wire and coil form with a matrix material using any suitable technique such as soft lithography and/or molding. The coil form can be removed from the probe matrix leaving a void sample volume (28) in the probe matrix. Advantageously, the NMR probes of the present invention allow for fill-factors approaching and achieving 100%.

21 Claims, 3 Drawing Sheets

ENHANCED FILL-FACTOR NMR COILS AND ASSOCIATED METHODS

RELATED APPLICATIONS

This application claims the benefit of U.S. Provisional Patent Application No. 60/756,476, filed Jan. 4, 2006 which is incorporated herein by reference.

FIELD OF THE INVENTION

The present invention relates generally to devices and methods for nuclear magnetic resonance (NMR) devices. More specifically, the present invention relates to increasing the signal-to-noise ratio in NMR devices by providing improved NMR probe coil assemblies. Accordingly, the present application involves the fields of physics, magnetism, and material science.

BACKGROUND OF THE INVENTION

Magnetic resonance spectroscopy currently is a widely used tool for characterizing chemical compounds. Chemical samples are currently contained within a quartz capillary tube or other type of vessel which is surrounded by a radio frequency coil. The capillary tube or vessel wall thickness separates the coil from the sample, effectively reducing the sensitivity by as much as 15% below the theoretical signal obtained from a 100% filled coil. In microscale NMR systems, this reduction in sensitivity is very undesirable because of the already low signal levels due to much smaller sample sizes. Consider the two-dimensional drawing representing existing coil 10 and capillary 12 systems given in FIG. 1. As can be seen in this figure, the capillary wall thickness 14 is wasted space that the sample cannot occupy, effectively reducing the sensitivity of the coil.

Microscale NMR spectroscopy provides the advantage of higher signal to noise ratios because of the drastically reduced resistance of the coil, but the signal level is lower because the sample size is so much smaller. As such, systems and materials capable of improving the signal-to-noise ratio which are relatively inexpensive and suitable for use in practical applications continue to be sought through ongoing research and development efforts.

SUMMARY OF THE INVENTION

Accordingly, the present invention provides an NMR probe which includes a probe matrix having a void sample volume therein. A conductive coil can be at least partially embedded in the probe matrix. By embedding the conductive coil in the probe matrix, the fill-factor can be significantly increased.

In another embodiment, a method of using an NMR probe can involve operatively connecting the NMR probe to an NMR unit within a magnetic field; inserting a fluid test sample within the void sample volume; applying an electrical current to the conductive coil; and detecting an output radio frequency and calculating an NMR spectrum for the test sample.

In a further embodiment of the present invention, a method of forming an NMR probe can include wrapping a conductive wire around a cylindrical form to produce a coil precursor assembly. A probe matrix can be formed around the conductive wire and cylindrical form with a matrix material. The cylindrical form can be removed leaving a void sample volume in the probe matrix.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

Figure 1:
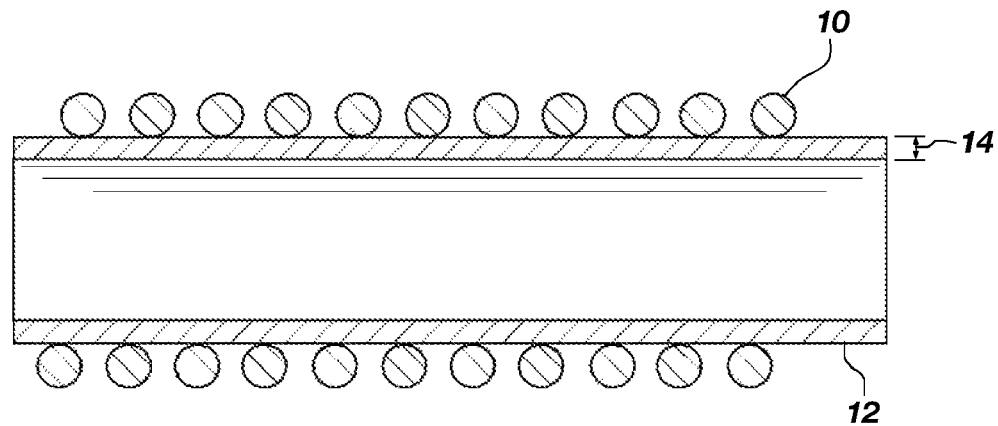
FIG. 1 is a cross-sectional view of a conventional NMR probe in accordance with the prior art.

The drawings will be described further in connection with the following detailed description. Further, these drawings are not necessarily to scale and are by way of illustration only such that dimensions and geometries can vary from those illustrated.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts It should also be understood that terminology employed herein is used for the purpose of describing particular embodiments only and is not intended to be limiting.

It must be noted that, as used in this specification and the appended claims, the singular forms "a," "an," and "the" include plural referents unless the context clearly dictates otherwise. Thus, for example, reference to "a coil" includes one or more of such coils, reference to "an NMR probe" includes reference to one or more of such devices, and reference to "applying" includes reference to one or more of such steps.

Definitions

In describing and claiming the present invention, the following terminology will be used in accordance with the definitions set forth below.

As used herein, "fill-factor" refers to the percent of void space which can be occupied by a test sample within the effective signal volume of the coil, i.e. the interior diameter of the coil. Conventional NMR probes have a fill-factor of around 85% for microscale NMR devices. Thus, a 95% fill-factor refers to a void volume of 95% and a 5% volume of other materials such as capillary wall materials or other non-sample mass.

As used herein, the term "embedded" when referring to the conductive coil refers to the coil being at least partially surrounded in the matrix material of the NMR probe, e.g. matrix material is displaced due to the presence of the conductive coil. The degree of embedding of the coil can vary but generally at least about 5% to 100% of the surface area of the conductive coil is embedded in the probe matrix.

As used herein, the term "probe matrix" refers to a material which alone or in combination with the conductive coil defines the sample volume. The probe matrix can be formed of a single material, layered material, composites, or any combination of materials which act as a suitable container for the sample volume and retainer for the conductive coil. The probe matrix can also be formed of any material which does not interfere with measured signals.

As used herein, "void" refers to a substantially empty space. Boundaries of the void sample volumes can be coextensive with an inner wall of the probe matrix, although this is not always required.

As used herein, "micro-NMR" refers to a probe having sample volume dimensions which are less than 1 mm, i.e. at least one dimension of void diameter, length, or wire diameter is less than 1 mm.

As used herein, "wire" is intended to refer to any conductive length of material, regardless of particular shape or cross-section.

As used herein, "substantial" when used in reference to a quantity or amount of a material, or a specific characteristic thereof, refers to an amount that is sufficient to provide an effect that the material or characteristic was intended to provide. The exact degree of deviation allowable may in some cases depend on the specific context. Similarly, "substantially free of" or the like refers to the lack of an identified element or agent in a composition. Particularly, elements that are identified as being "substantially free of" are either completely absent from the composition, or are included only in amounts which are small enough so as to have no measurable effect on the composition.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 micron to about 5 microns" should be interpreted to include not only the explicitly recited values of about 1 micron to about 5 microns, but also include individual values and sub-ranges within the indicated range. Thus, included in this numerical range are individual values such as 2, 3, and 4 and sub-ranges such as from 1-3, from 2-4, and from 3-5, etc.

This same principle applies to ranges reciting only one numerical value. Furthermore, such an interpretation should apply regardless of the breadth of the range or the characteristics being described.

The Invention

In accordance with the present invention, an NMR probe can include a probe matrix having a void sample volume therein. More particularly, a conductive coil can be at least partially embedded in the probe matrix. The conductive coil can also be operatively connected to a suitable electronic signal processor such as those conventionally used in NMR devices. By embedding the conductive coil in the probe matrix, the fill-factor can be significantly increased with a resulting increase in the signal-to-noise ratio.

The void sample volume can be almost any shape which is suitable for holding a small sample such as a liquid or gas. The void sample volume can also be shaped to improve repeatability of results, as well as make cleaning and/or manufacture easier. Therefore, the void sample volume can most often be substantially free of discontinuities along interior walls, e.g. corners, edges, etc. Currently preferred, the void sample volume can be a cylindrical cavity. Alternatively, other volume shapes can be formed which are functional for placement of a fluid test sample. The specific dimensions of the probe are not particularly limited. Dimensions and capacity can be adjusted depending on the desired sample volume. For example, sample volumes can range from several hundred microliters down to several picoliters. In one currently preferred aspect, the probes of the present invention can have sample volumes from about 100 pL to about 40 µL, and preferably about 20 µL.

In one specific aspect of the present invention, the cylindrical cavity can have a diameter from about 50 µm to about 200 µm, and preferably from about 110 µm to about 140 µm. Similarly, the cylindrical cavity can have the conductive coil around a length of the cavity from about 200 µm to about 500 µm. However, it will be understood that dimensions outside this range can also be suitable. For example, the current limit of micro-NMR probes is about 50 µm, although it is expected that smaller dimensions will become available and such can be used in connection with the present invention.

Although the fill-factor can be a function of the absolute dimensions of the probe, micro-NMR probes are of particular interest in enhancing fill-factor. In accordance with the present invention, the fill-factor can be from about 90% to 100%, from about 95 to 100%, more preferably from about 97% to 100%, and most preferably about 100%. The fill-factor is directly proportional to the improvement in S-N ratio, i.e. a 10% increase in fill-factor will increase S-N ratio by 10%, assuming no other noise sources are also affected.

Generally, the probe matrix material can be any material which can be effectively formed into the desired shape around the coil with minimal formation of gas pockets or other undesirable anomalies and is chemically compatible with fluid test samples, i.e. non-degradable, non-conductive, inert, and does not adversely affect NMR readings. Thermoplastic elastomers, bio-compatible resins, or thermoset polymers can be useful, although other materials can also be used such as, but not limited to, polypropylene, block copolymers, etc. Further, the probe matrix can comprise a material selected from the group consisting of polydimethylsiloxane, polytetrafluoroethylene, polypropylene, polyethylene, epoxy resin, and combinations of these materials. In addition, a wide variety of other materials can also be selected which can be formed and do not detrimentally react with samples. Other materials can include PZT, quartz, spin-on glass, and the like. Care can be taken to ensure that the deposited and formed probe matrix does not adhere too strongly to the coil form so that removal of the coil form can be readily accomplished. Although quartz may be used in the manufacture of the NMR probes/sample containers of the present invention, it is not required.

The ability to manufacture the probe without the use of quartz can meaningfully reduce the costs of both the manufacture and the use of the probes/sample containers. In one aspect of the invention the probes can be configured to be disposable after a single use. In another aspect the probes can be configured for repeated use. To aid in repeated use the probes of the present invention can be configured to allow for easy cleaning of the sample void. In one aspect the interior walls of the sample void or container can be coated with a nano-film coating in order to allow for easier cleaning and/or improved durability. Such films are distinct from the probe matrix material and generally have minimal impact on the fill volume.

In accordance with one aspect of the present invention, NMR probes can be formed by a method which includes wrapping a conductive wire around a coil form to produce a coil precursor assembly. A probe matrix can be formed around the coil precursor assembly, including at least a portion of the conductive wire and coil form, with a matrix material using any suitable technique. The coil form can be removed from the probe matrix leaving a void sample volume in the probe matrix.

The coil form can be any material which can act to retain the desired shape for the coil and can be removed. Non-limiting examples of potentially suitable material for use as the form can include fibers, metals, ceramics, polymers, and composites or combinations of these materials including non-brittle substances. Most often the coil form can be a fiber such as, but not limited to, polytetrafluoroethylene fiber, optical fiber, or composite fibers. Alternatively, the coil form can be a cylindrical member such as a needle or the like. Other cylindrical or fiber materials can also be used so long as the material can be removed and has a surface which is sufficiently smooth to allow NMR readings in the final probe produced thereby. For example, an inexpensive material can be coated with a non-stick coating. In addition, a cylindrical form can be preferred; however, other shapes can also be suitable. For example, materials having a square or elliptical cross-section can also be used, if desired. In particular, mass production can benefit from the use of rectangular or square coils since such can be easier to form using soft lithography or other similar techniques. Although the resulting signal from non-circular coils may be less homogeneous, such effects can generally be accounted for by those skilled in the art.

Figure 2:
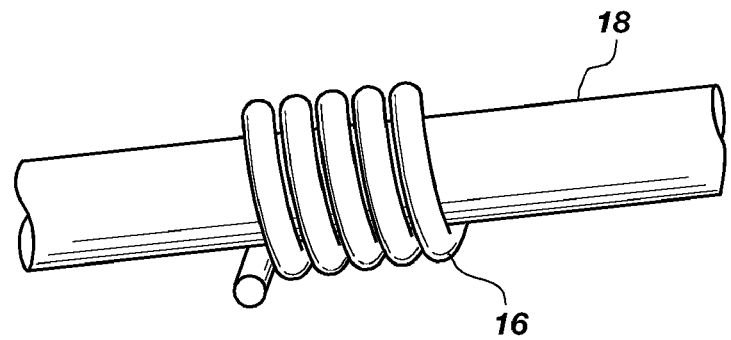
FIG. 2 illustrates wrapping of a conductive wire around a cylindrical form in accordance with one embodiment of the present invention. The gauge of the needle, the gauge of the wire, and the number of windings are all design parameters, and can be changed depending on the particular probe design.

The coil can be formed by wrapping a suitable wire around the coil form. The wire can be any conductive material which can carry sufficient electrical signal to function as an NMR coil. Currently preferred wire material can include, or consist essentially of, copper, although other materials can be suitable. In accordance with one embodiment of the present invention, a very rigid needle can be wound with various wire diameters resulting in various sized probes. The illustration shown in FIG. 2 includes a wire 16 having 5 windings wrapped around a cylindrical pole 18. The success of the completed device can be largely influenced by the precision of this portion of the manufacturing step, at least partially due to the small scale of these devices.

Figure 3:
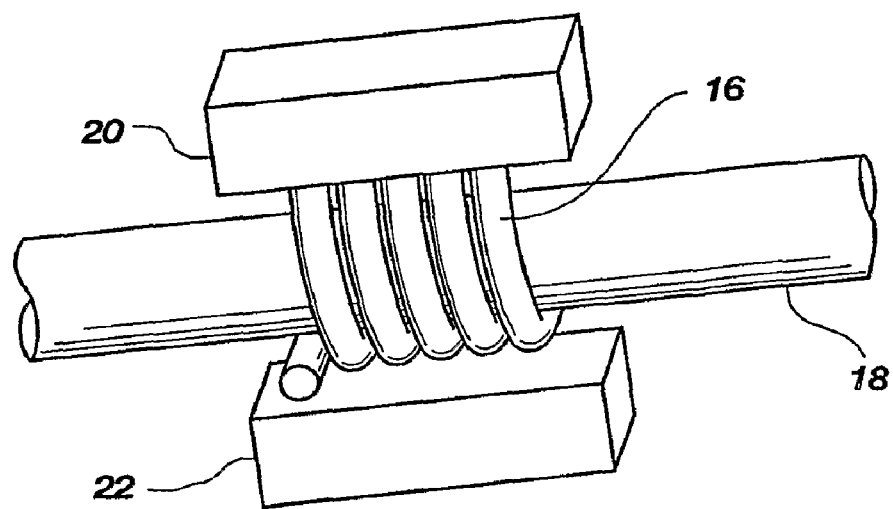
FIG. 3 illustrates a wrapped assembly of FIG. 2 including a portion of a mold in accordance with one embodiment of the present invention.

In an additional aspect of the present invention, a mold can be oriented around the coil precursor assembly. The mold can have an interior volume which conforms to a desired shape of the exterior of the NMR probe. The mold can be formed of any suitable material, preferably a material which can be repeatedly used with sufficient durability and has contours and surfaces which are conducive to removal of matrix material therefrom. For example, metal or plastic materials can be machined or molded into the desired shape. The fabrication required to obtain the enclosed wire-wound capillary can require careful attention. In order to maximize the magnetic field between the poles of the magnetic system, the gap can be as small as possible (minimum of ~0.005 inch). This can be accomplished by machining a magnetic system blank, or a copy made out of aluminum to do the molding. For example, FIG. 3 shows two plates 20 and 22 on top and under the wire wrapped needle, respectively, of FIG. 2.

The mold can be at least partially filled with the matrix material. During filling, the matrix material can flow into gaps between loops of the coil and gaps between the curved portions of the conductive wire and the cylindrical or coil form. The matrix material thus at least partially surrounds the coil to form the NMR probe of the present invention. In FIG. 3, the assembly can be dipped in a liquid matrix material with excess material removed subsequent to formation of the matrix.

Figure 4:
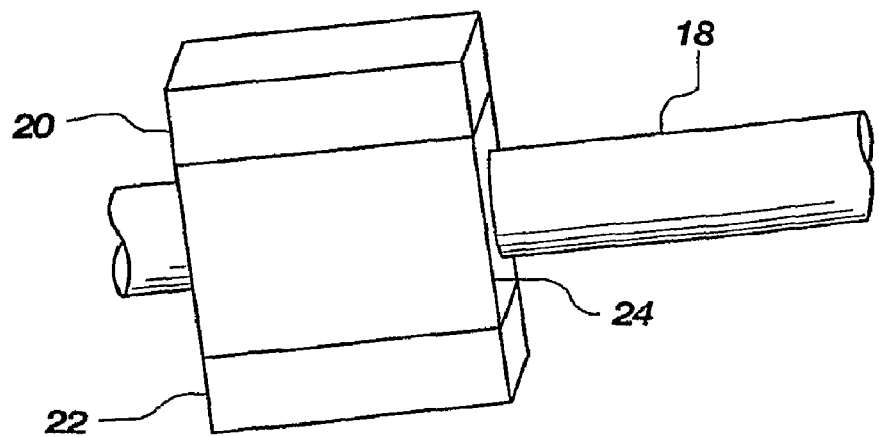
FIG. 4 illustrates the assembly of FIG. 3 encased in a probe matrix material in accordance with one embodiment of the present invention.

For example, in one alternative embodiment, once a needle (i.e. coil form) and coil are properly positioned between the pole pieces acting as the mold, PDMS can be poured into the mold and cured. Many different materials can be used as the probe matrix material as described previously. PDMS can be readily used and is a readily available and relatively inexpensive. Thus, a fluidic capillary or channel is formed that has an inside diameter that matches the inside diameter of a coil. FIG. 4 shows how the coil and middle section of the needle 18 can be immersed in PDMS 24. After the PDMS is cured, the encapsulated needle and coil can be removed from the mold. The needle can then be removed very slowly by pulling on one end. PDMS does not bind to metallic materials so removal is possible without damage to interior surfaces of the PDMS capillary. After the needle, i.e. coil form, is successfully removed from the coil/PDMS the capillary is complete, although other steps may be necessary to form a final product.

In another alternative embodiment, the matrix material and/or coil wire can be formed using other techniques such as, but not limited to, extrusion molding, spray coating, vapor deposition coating (e.g. LEPVD, CVD, PVD, atomic vapor deposition, etc.), dipping, soft lithography, mircofabrication, electroplating, or the like. However, any method of forming the matrix material should generally avoid formation of air pockets or other non-homogeneities which can interfere with magnetic resonance signals. As an illustration of one alternative embodiment, both the wire and the probe matrix can be deposited using a deposition step such that the wire is formed as the NMR probe is formed, e.g. soft lithography, vapor deposition, etc. Thus, the entire NMR probe can be formed via deposition processes without the need for a step of wrapping a wire around a coil form.

Figure 5:
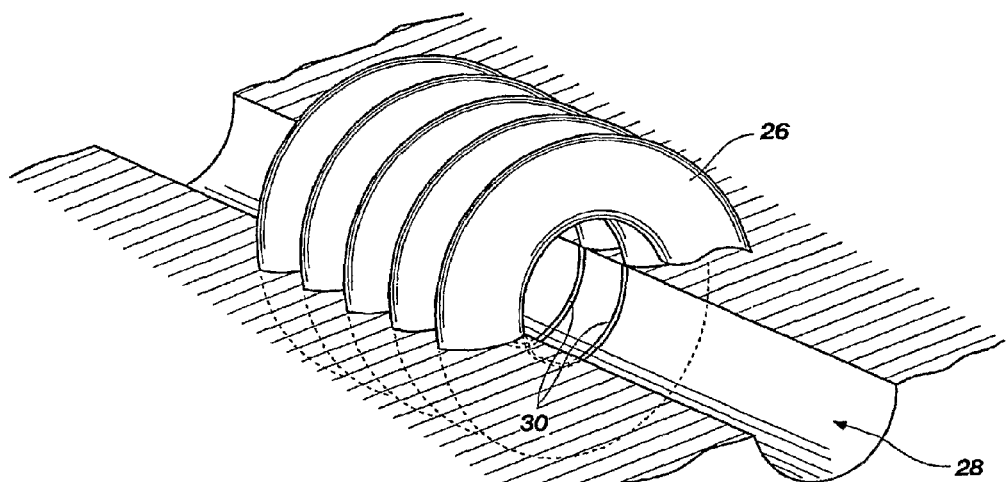
FIG. 5 is a cutaway view of an NMR probe with the cylindrical form and mold removed in accordance with one embodiment of the present invention.

The NMR coil/capillary systems of the present invention can be readily fabricated using the methods of the present invention or other variations which may occur to those skilled in the art based on the teachings herein. The drawing in FIG. 5 shows an inside circumference 30 of the coil 26 matching the outside diameter of the capillary 28, i.e. defined by the probe matrix (partially cut-away), because they are one in the same. Deviations from 100% fill-factor are possible if the wire is not wrapped tightly around the needle before encapsulation.

Most often it is desirable to tightly wrap the conductive wire around the coil form leaving substantially no space between wrapped portions of the conductive wire and the cylindrical or coil form. In this way, the fill-factor can approach or even reach 100%. However, the wire can be wrapped less tightly and allowed to leave a space such that the fill-factor is slightly lower, e.g. 97% or even 90% in some cases. Typically, it can be desirable to provide a fill-factor of about 97% to 100%, although values outside this range can also be suitable. In this case, the conductive wire is either contacting the inner surface of the void sample volume or a few microns, e.g. about 0.1 μm to about 10 μm recessed into the probe matrix, although these ranges may vary depending on the relative size of the void sample volume and the coil dimensions.

Alternatively, the conductive wire can be slightly exposed within the void sample volume. This can be accomplished in a variety of ways. In one aspect, the probe matrix material can be etched or dissolved away to intentionally expose a portion of the conductive coil. Alternatively, a soft material can be used as the coil form such that wrapping allows the conductive wire to slightly push into the coil form. In this case, the coil form may be removed by mechanical force or may be removed by chemical means, e.g. a solvent which dissolves the soft material without substantially damaging the matrix material. After forming the probe matrix and removing the form, the conductive wire can be partially exposed. Care can be taken to prevent shorting during use, such as by choosing a non-conductive testing solution and/or coating the conductive wire with a thin insulation coating. Regardless, a slightly exposed coil ensures that the fill factor is at least 100%.

Regardless of the fill factor chosen, the coil form can be removed using any process which allows for removal without damaging the coils or probe matrix material to leave an NMR probe having a designed void sample volume. In one currently preferred aspect, the cylindrical form can be removed by mechanically pulling the cylindrical form from the matrix material. Alternatively, the cylindrical form can be dissolved or otherwise destroyed. Further, the matrix material and/or coil can be optionally finished in order to produce a final product. For example, the matrix material can be shaped, polished, or ground, in order to remove excess material and/or to create a suitable fit within the NMR device.

An NMR probe of the present invention can further include features which allow electrical connection to an NMR device for operation. Unlike conventional NMR tubes, those of the present invention include a conductive coil integrated into the sample tube. Therefore, suitable electrical connectors can be included which allow the coil to electrically communicate with the NMR device. In one embodiment of the invention, at least one conductive contact can be included on the exterior of the probe matrix. Such a conductive contact can be directly or indirectly connected to the conductive coil to provide flow of electricity to the coil when the probe is in use. Such contacts can take various forms and be made of a variety of materials so long as they are conductive and can provide adequate flow of electricity to the conductive coil in the probe. In one embodiment the conductive contact can be a portion of the conductive coil itself which is exposed through the exterior surface of the probe matrix. The conductive contacts can allow for easy use of the probes as they do not require that the conductive probe be permanently wired to the NMR device in order to function. The conductive contacts also allow the probes to be readily replaced in the NMR device facilitating rapid testing, which can be of particular advantage when the compounds tested are not stable or have a very short lifespan.

The NMR probes of the present invention are particularly suitable for incorporation into either conventional NMR units or smaller micro-NMR units. However, the principles of the present invention are of particular use in micro-NMR units where improvement in the fill-factor has a significant effect on the S-N ratio. NMR probes can be operatively connected to an NMR unit within a magnetic field. A fluid test sample can be inserted within the void sample volume and an electrical current can be applied to the conductive coil. An output radio frequency can be detected such that resulting data can be collected and manipulated to calculate an NMR spectrum for the test sample. Further, the NMR probes of the present invention would not require any modification of existing micro-NMR devices.

Advantageously, the NMR probes of the present invention allow for fill-factors approaching and achieving 100% as described previously. This is particularly useful in smaller micro-NMR devices where the sample volume is small compared to the signal. An increase in the fill-factor effectively increases the signal-to-noise ratio allowing for clearer and more reliable readings than would otherwise be available for the same size unit. In one embodiment of the present invention, the NMR unit can be portable and can include a magnetic field generation system as described and disclosed in U.S. Provisional Patent Application 60/756,592, filed Jan. 4, 2006, entitled High Field Strength Magnetic Field Generation System and Associated Methods, which is hereby incorporated by reference in its entirety. In the particular embodiment, first and second magnetic flux concentrators can each be spaced apart to form a sample volume, said first and second magnetic flux concentrators having a magnetic field saturation. A first set of auxiliary permanent magnets can be oriented about a portion of the first magnetic flux concentrator remote from the sample volume and each of the first set of auxiliary permanent magnets can be oriented in a magnetically repulsive orientation with respect to each of the first set of auxiliary permanent magnets. A second set of auxiliary permanent magnets can be oriented about a portion of the second magnetic flux concentrator remote from the sample volume and each of the second set of auxiliary permanent magnets can be oriented in a magnetically repulsive orientation with respect to each of the second set of auxiliary permanent magnets and magnetically associated via the first and second magnetic flux concentrators. Additionally, the magnetic field strength can be varied by movably orienting at least one magnetically soft shunt in a proximity to at least one of the first and second magnetic flux concentrators, said proximity being sufficient to effect a change in the magnetic field strength.

With the use of soft lithography and/or other molding techniques the above described devices can be readily manufactured. The method of the present invention can be simpler than conventional wrapping wire around a quartz capillary tube, and the coil volume can be completely filled with the fluid test sample. In other words, the devices of the present invention can provide a system where nuclear concentration can be maximized for a given coil diameter. Fluid test-samples can be introduced into the NMR cell via syringe needles inserted into holes left in the PDMS after removal of the fiber.

The present invention represents a breakthrough in microscale NMR development by substantially eliminating fill-factor limitations and improving signal-to-noise ratios.

EXAMPLE

The following example illustrates an exemplary embodiment of the invention. However, it is to be understood that the following is only exemplary or illustrative of the application of the principles of the present invention. Numerous modifications and alternative compositions, methods, and systems may be devised by those skilled in the art without departing from the spirit and scope of the present invention. The appended claims are intended to cover such modifications and arrangements. Thus, while the present invention has been described above with particularity, the following example provides further detail in connection with what is presently deemed to be a practical embodiment of the invention.

Figure 6A:
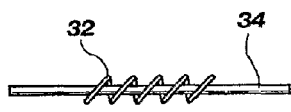
FIGS. 6A through 6E illustrate a set of process steps and mold assemblies in accordance with another embodiment of the present invention. The steps as illustrated in the figures include winding a copper wire around a Teflon coated fiber optic cable, immersing the wrapped cable in PDMS, and allowing the PDMS to cure. Once cured the Teflon cable can be removed from the cured PDMS/wire structure leaving a probe with a void sample volume.
Figure 6B:
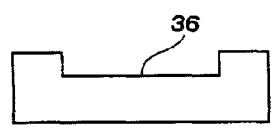
Figure 6C:
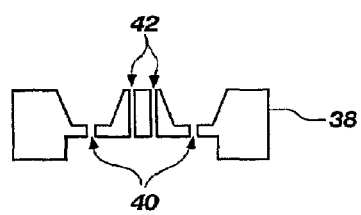
Figure 6D:
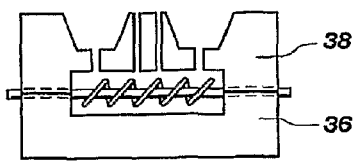
Figure 6E:
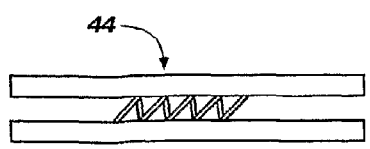

An NMR probe was fabricated according to the method outlined by FIGS. 6A through 6E using a 125 μm diameter optical fiber cable. The resulting sample capillary and probe encompasses a volume of about 19.6 μL having a 400 μm length. More specifically, a 99.99% pure copper wire 32 is wrapped around a Teflon coated fiber optic cable 34 in a tight helix as shown in FIG. 6A. The helix is held together using a small amount of super glue, although other adhesives could be used. Teflon cable allows for easy removal subsequent to forming. A Plexiglas molding base 36 is fabricated to hold the cable and helix copper wire probe as shown in FIG. 6B. A corresponding Plexiglas molding cap 38 is also fabricated as shown in FIG. 6C having injection ports 40 for injection of the matrix material, e.g. PDMS, and ventilation ports 42 to allow for escape of gases during injection. Plexiglas can be readily machined, is inexpensive, and does not bond with PDMS such that this material can make a suitable mold material for this embodiment of the present invention. As shown in FIG. 6D, the fiber optic cable and copper helix assembly can be secured to the molding base 36 at a depth of half the mold depth. The Plexiglas cap can then be secured on the lower portion of the mold. This assembly can then be placed in a vacuum chamber and a reservoir containing PDMS (or other suitable matrix material) can be allowed to flow into the mold. Gas permeable materials such as PDMS can optionally include an additional polymer coating to prevent adverse effects of gas permeating into the fluid test sample. The molding cap and molding base can be removed along with the fiber coil form to leave the NMR probe assembly 44 shown in FIG. 6E having a 100% fill-factor.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. An NMR probe, comprising:
    a) a probe matrix having a uniform composition, an inner surface of the probe matrix defining a void sample volume therein; and
    b) a conductive coil at least partially embedded in the probe matrix.

2. The probe of claim 1, wherein the void sample volume is a cylindrical cavity.

3. The probe of claim 2, wherein the cylindrical cavity has a diameter from about 50 μm to about 200 μm.

4. The probe of claim 1, wherein the NMR probe is a micro-NMR probe.

5. The probe of claim 1, wherein the void sample volume is a non-cylindrical cavity.

6. The probe of claim 1, wherein the probe has a fill-factor of about 97% to 100%.

7. The probe of claim 6, wherein the fill-factor is about 100%.

8. The probe of claim 1, wherein the probe matrix comprises a material selected from the group consisting of polydimethylsiloxane, polytetrafluoroethylene, polyethylene, polypropylene, spin-on glass, and combinations thereof.

9. The probe of claim 1, wherein the void sample volume has interior walls coated with a nano-film.

10. A method of forming an NMR probe, comprising:
    a) forming a conductive coil embedded in a probe matrix having a uniform composition, an inner surface of the probe matrix defining a void sample volume at least partially within an interior volume of the conductive coil.

11. The method of claim 10, wherein the step of forming includes:
    a) wrapping a conductive wire around a cylindrical form to produce a coil precursor assembly;
    b) forming the probe matrix around the conductive wire and cylindrical form with a matrix material; and
    c) removing the cylindrical form leaving the void sample volume in the probe matrix.

12. The method of claim 11, wherein the cylindrical form is a needle, polytetrafluoroethylene fiber, optical fiber, or combination or composite thereof.

13. The method of claim 11, wherein the step of forming further includes orienting a mold around the coil precursor assembly and at least partially filling the mold with the matrix material.

14. The method of claim 10, wherein the step of forming includes a deposition process or soft lithography process.

15. The method of claim 10, wherein the probe matrix comprises a material selected from the group consisting of polydimethylsiloxane, polytetrafluoroethylene, polyethylene, and combinations thereof.

16. The method of claim 11, wherein wrapping the cylindrical form leaves substantially no space between wrapped portions of the conductive wire and the cylindrical form.

17. The method of claim 10, wherein the NMR probe has a fill-factor of about 90% to 100%.

18. The method of claim 10, further comprising the step of coating the void sample volume in the probe matrix with a nano-film.

19. A method of using a probe including a probe matrix having a uniform composition, an inner surface of the probe matrix defining a void sample volume therein, and a conductive coil at least partially embedded in the probe matrix, the method comprising:
    a) operatively connecting the NMR probe to a micro-NMR unit within a magnetic field;
    b) inserting a fluid test sample within the void sample volume;
    c) applying an electrical current to the conductive coil; and
    d) detecting an output radio frequency and calculating an NMR spectrum for the test sample.

20. The method of claim 19, wherein the NMR probe has a fill factor of about 100%.

21. The method of claim 19, wherein the probe is disposed of after a single use.

* * * * *

UNITED STATES PATENT AND TRADEMARK OFFICE
CERTIFICATE OF CORRECTION

| | | |
|---|---|---|
| PATENT NO. | : 8,269,497 B2 | Page 1 of 1 |
| APPLICATION NO. | : 12/159848 | |
| DATED | : September 18, 2012 | |
| INVENTOR(S) | : James C. Stephenson et al. | |

It is certified that error appears in the above-identified patent and that said Letters Patent is hereby corrected as shown below:

In the Specification

Column 1, line 4, add:

GOVERNMENT INTEREST

This invention was made with government support under DGE9987616 awarded by the National Science Foundation. The government has certain rights in the invention.

Signed and Sealed this
Eighteenth Day of August, 2015

Michelle K. Lee
*Director of the United States Patent and Trademark Office*